US 8,315,108 B2

(12) United States Patent
Shimizu (10) Patent No.: US 8,315,108 B2
(45) Date of Patent: Nov. 20, 2012

(54) MEMORY INTERFACE CIRCUIT

(75) Inventor: Yuui Shimizu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 12/884,914

(22) Filed: Sep. 17, 2010

(65) Prior Publication Data

US 2011/0128768 A1 Jun. 2, 2011

(30) Foreign Application Priority Data

Nov. 30, 2009 (JP) ................................. 2009-271334

(51) Int. Cl.
*G11C 7/10* (2006.01)
(52) U.S. Cl. ......... 365/189.05; 365/189.14; 365/189.17; 365/189.07; 365/208
(58) Field of Classification Search ............. 365/189.14, 365/189.17, 189.05, 189.07, 208
See application file for complete search history.

(56) References Cited

U.S. PATENT DOCUMENTS

| | | | |
|---|---|---|---|
| 7,542,507 B2 | 6/2009 | Sohn | |
| 2004/0047207 A1* | 3/2004 | Mori et al. | 365/202 |
| 2007/0019469 A1* | 1/2007 | Motoki | 365/185.03 |

FOREIGN PATENT DOCUMENTS

| | | |
|---|---|---|
| JP | 2004-266403 | 9/2004 |
| JP | 2004-343277 | 12/2004 |
| JP | 2005-341582 | 12/2005 |

OTHER PUBLICATIONS

Young-Soo Sohn, et al., "A 1.2Gbps CMOS DFE Receiver with the Extended Sampling Time Window for Application to the SSTL Channel", 2002 Symposium on VLSI Circuits Digest of Technical Papers, pp. 92-93.
Kun-Yung Ken Chang, et al., "A 2Gb/s/pin CMOS Asymmetric Serial Link", 1998 Symposium on VLSI Circuits Digest of Technical Papers, pp. 216-217.

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

According to one embodiment, a differential circuit receives, as differential inputs, a readout signal read out from a semiconductor storage element and a reference voltage. An equalizing circuit controls, taking into account a state of a past input signal output from the differential circuit, the potential of the present differential signal output from the differential circuit. A sense amplifier detects a state of the differential signal output from the equalizing circuit. A state holding circuit holds a past state of the differential signal detected by the sense amplifier and supplies the state to the equalizing circuit.

20 Claims, 9 Drawing Sheets

MEMORY INTERFACE CIRCUIT

CROSS-REFERENCE TO RELATED APPLICATIONS

This application is based upon and claims the benefit of priority from the prior Japanese Patent Application No. 2009-271334, filed on Nov. 30, 2009; the entire contents of which are incorporated herein by reference.

FIELD

Embodiments described herein relate generally to a memory interface circuit.

BACKGROUND

In a multi chip package (MCP) used in a memory card or a solid state drive (SSD), memory chips such as NAND memories are stacked to increase a data storage capacity. The number of memory chips connected per one channel increases. In other words, a plurality of output buffers for outputting data stored in the memory chips to the outside of the memory chips are connected to each of channels in parallel.

Therefore, a load capacitance applied to output buffers of the memory chips increases. When an output circuit for transitioning a signal from a ground level to a power supply level at full amplitude between power supply potentials is adopted, in some case, deterioration in a readout waveform in which the signal falls before sufficiently rising (so-called inter symbol interference (ISI)) occurs and wrong readout is caused. As a method for coping with such a problem, there is a method of increasing the size of the output buffers and increasing a driving ability of the output buffers.

For example, Japanese Patent Application Laid-Open No. 2005-341582 discloses a method of controlling timing of activation of a sampling clock signal in response to a phase of a signal over-sampled in response to a variable equalizing control signal to sufficiently compensate for a timing error and a voltage error caused by the inter symbol interference.

However, when the size of the output buffers is increased, because parasitic capacitance of the output buffers also increases, the load capacity applied to the output buffers of the memory chips further increases. As a result, it is impossible to sufficiently cope with the wrong readout.

DETAILED DESCRIPTION

In general, according to one embodiment, a memory interface circuit provided in a controller that performs reading and writing control for a semiconductor storage element and configured to exchange signals between the semiconductor storage element and the controller includes a differential circuit, an equalizing circuit, a sense amplifier, and a state holding circuit. The differential circuit receives, as differential inputs, a readout signal read out from the semiconductor storage element and a reference voltage. The equalizing circuit controls, taking into account a state of a past input signal output from the differential circuit, the potential of the present differential signal output from the differential circuit. The sense amplifier detects a state of the differential signal controlled by the equalizing circuit. The state holding circuit holds a past state of the differential signal detected by the sense amplifier and supplies the state to the equalizing circuit. Setting parameters of the equalizing circuit are stored in respective memory chips.

Exemplary embodiments of a memory interface circuit will be explained below in detail with reference to the accompanying drawings. The present invention is not limited to the following embodiments.

Figure 1A:
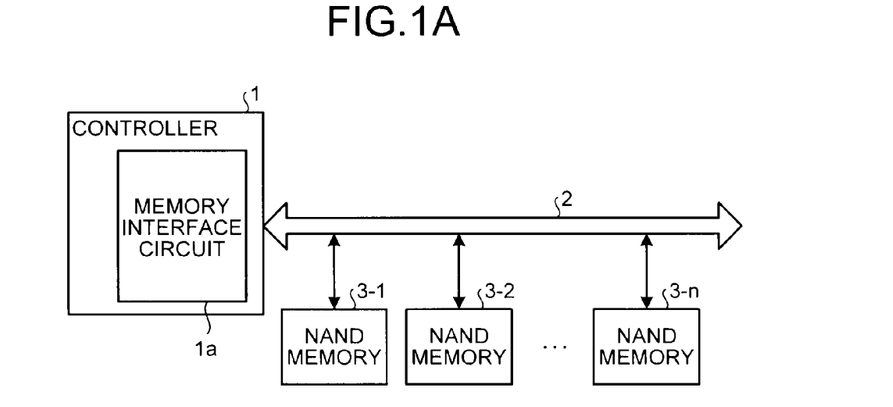
FIG. 1A is a block diagram of a schematic configuration of a semiconductor storage device to which an interface circuit according to a first embodiment of the present invention is applied.
Figure 1B:
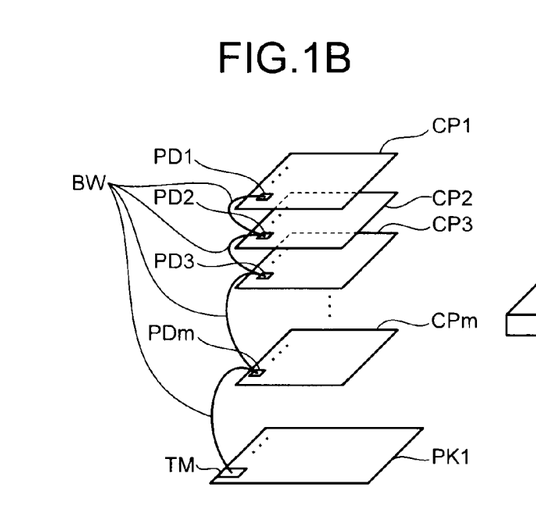
FIG. 1B is a perspective view of a schematic configuration of layers of a NAND memory 3-1 shown in FIG. 1A.
Figure 1C:
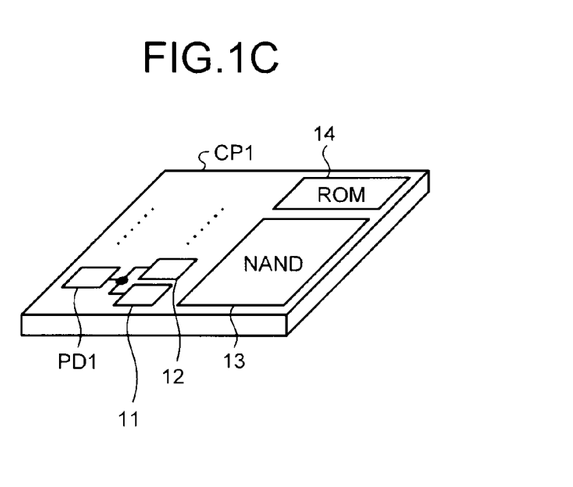
FIG. 1C is a perspective view of a schematic configuration of a semiconductor chip CP1 shown in FIG. 1B.

FIG. 1A is a block diagram of a schematic configuration of a semiconductor storage device to which a memory interface circuit according to a first embodiment of the present invention is applied. FIG. 1B is a perspective view of a schematic configuration of layers of a NAND memory 3-1 shown in FIG. 1A. FIG. 1C is a perspective view of a schematic configuration of a semiconductor chip CP1 shown in FIG. 1B.

In FIG. 1A, the semiconductor storage device includes n (n is an integer equal to or larger than 2) NAND memories 3-1 to 3-n and a controller 1 that performs drive control for the NAND memories 3-1 to 3-n. Examples of the drive control for the NAND memories 3-1 to 3-n include reading and writing control, block selection, error correction, and wear leveling for the NAND memories 3-1 to 3-n.

The controller 1 includes a memory interface circuit 1a that exchanges signals between the controller 1 and the NAND memories 3-1 to 3-n. The memory interface circuit 1a can detect states of present signals read out from the NAND memories 3-1 to 3-n while referring to states of past signals read out from the NAND memories 3-1 to 3-n. Specifically, the memory interface circuit 1a can control the potential of the present signals read out from the NAND memories 3-1 to 3-n to be alienated from the states of the past signals read out from the NAND memories 3-1 to 3-n.

For example, when a state of a signal read out one cycle before is '0', the memory interface circuit 1a can raise the potential of a signal read out this time such that a state of the signal read out this time is close to '1'. When the state of the signal read out one cycle before is '1', the memory interface circuit 1a can lower the potential of the signal read out this time such that the state of the signal read out this time is close to '0'.

The NAND memories 3-1 to 3-n are connected to the controller 1 in parallel to one another via a channel 2. For example, the NAND memory 3-1 includes m (m is an integer equal to or larger than 2) semiconductor chips CP1 to CPm as shown in FIG. 1B. For example, the semiconductor chip CP1 is mounted with a NAND flash memory 13. Pad electrodes PD1 to PDm connected to the NAND flash memory 13 are formed in the semiconductor chip CP1. The NAND flash memory 13 can include, for example, a unit cell array, a decoder, a sense amplifier, a charge pump circuit, a page buffer, and the like.

As shown in FIG. 1C, the semiconductor chip CP1 includes an input buffer 11, an output buffer 12, and a programmable ROM 14. The input buffer 11 can pass control signals for write data, an address, and the like, which are sent from the controller 11, to the NAND flash memory 13 or the like. The output buffer 12 can pass readout data read out from the NAND flash memory 13 or the like to the controller 1. The output buffer 12 can be used as an interface of a single-end type. The output buffer 12 can use a signal transitioned between a power supply and a ground level at full amplitude. As the input buffer 11 and the output buffer 12, for example, a circuit including a P-channel metal oxide semiconductor (PMOS) and an N-channel metal oxide semiconductor (NMOS) connected in series can be used.

When a state of the present signal read out from the semiconductor chip CP1 by the memory interface circuit 1a is detected, the programmable ROM 14 can store a set value for setting a contribution of a state of a past signal read out from the semiconductor chip CP1. The set value can be optimized according to a transistor characteristic or the like of the NAND flash memory 13 provided in the semiconductor chip CP1. The same holds true for the semiconductor chips CP2 to CPm other than the semiconductor chip CP1.

The m semiconductor chips CP1 to CPm are mounted on one semiconductor package PK1. An external terminal TM of the semiconductor package PK1 is shared by pad electrodes PD1 to PDm of the m semiconductor chips CP1 to CPm. A method of mounting the semiconductor chips CP1 to CPm on the semiconductor package PK1 can be a method of stacking the semiconductor chips CP1 to CPm or can be a method of arraying the semiconductor chips CP1 to CPm on the same plane. The semiconductor chips CP1 to CPm can be mounted face down or can be mounted face up. As a method of causing the m pad electrodes PD1 to PDm to share the one external terminal TM, the m pad electrodes PD1 to PDm and the one external terminal TM can be connected by a bonding wire BW. Alternatively, it is also possible to flip-mount the semiconductor chips CP1 to CPm and connect the pad electrodes PD1 to Dm and the external terminal TM to each other via bump electrodes formed in the pad electrodes PD1 to PDm. Alternatively, it is also possible to form through electrodes and connect the pad electrodes PD1 to PDm and the external terminal TM via the through electrodes. The same holds true for the NAND memories 3-2 to 3-n other than the NAND memory 3-1. The semiconductor storage device can be used as a storage device such as a memory card or an SSD.

Figure 2:
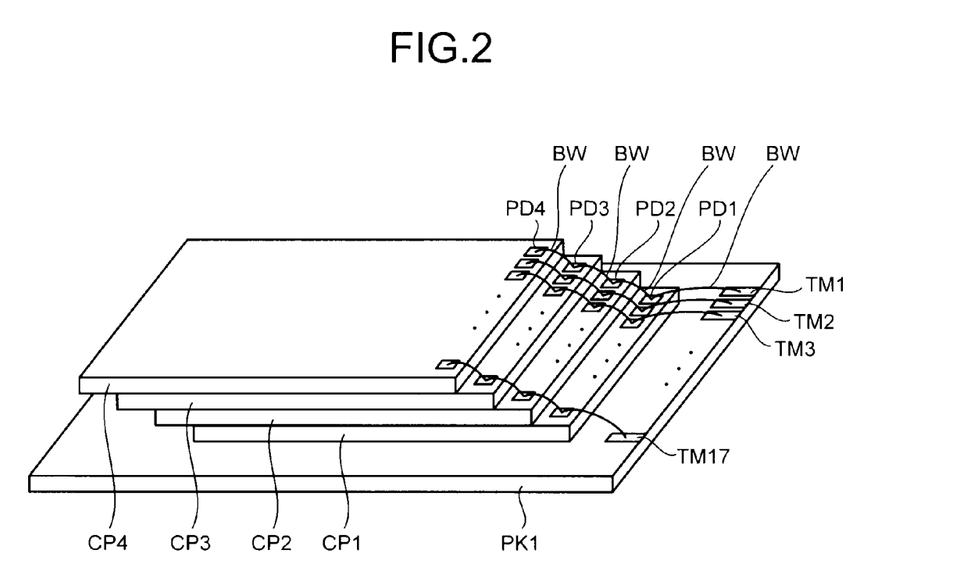
FIG. 2 is a perspective view of an example of a schematic configuration of the NAND memory 3-1 shown in FIG. 1A.

FIG. 2 is a perspective view of an example of a schematic configuration of the NAND memory 3-1 shown in FIG. 1A. In the example shown in FIG. 2, m is set to 4.

In FIG. 2, the pad electrodes PD1 to PD4 are respectively formed on the semiconductor chips CP1 to CP4. The pad electrodes PD1 to PD4 can be used as, for example, address terminals, read and write terminals, chip select terminals, or data terminals. External terminals TM1 to TM17 are formed on the semiconductor package PK1. When the four semiconductor chips CP1 to CP4 are stacked and mounted on the semiconductor package PK1, the semiconductor chips CP1 to CP4 can be stacked to be shifted from one another to expose the pad electrodes PD1 to PD4. For example, the pad electrodes PD1 to PD4 are connected in common to the external terminal TM1 via the bonding wire BW. This makes it possible to cause the pad electrodes PD1 to PD4 of the four semiconductor chips CP1 to CP4 to share the one external terminal TM1.

Figure 3:
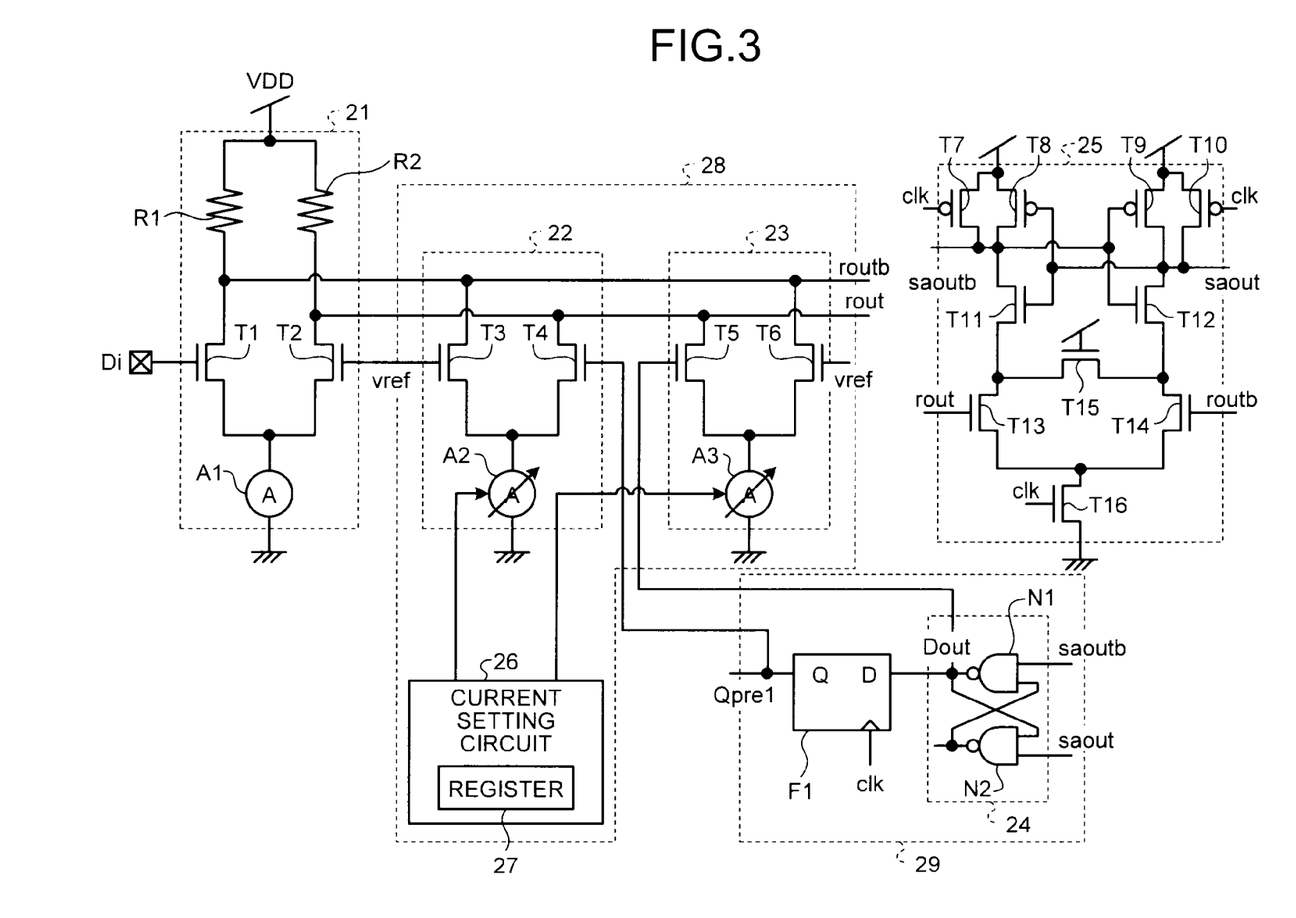
FIG. 3 is a circuit diagram of an example of a schematic configuration of the memory interface circuit shown in FIG. 1A.

FIG. 3 is a circuit diagram of an example of a schematic configuration of the memory interface circuit shown in FIG. 1A.

In FIG. 3, the memory interface circuit 1a includes a differential circuit 21, an equalizing circuit 28, a latch-type sense amplifier 25 that detects a state of a differential signal controlled by the equalizing circuit 28, and a state holding circuit 29.

The differential circuit 21 can receive a readout signal Di read out from the NAND memories 3-1 to 3-n and a reference voltage vref as differential inputs and generate differential signals rout and routb as differential outputs. The equalizing circuit 28 can control the potential of the present differential signals rout and routb output from the differential circuit 21 to be alienated isolated from states of the past differential signals rout and routb output from the differential circuit 21. The latch-type sense amplifier 25 can detect, in synchronization with a clock signal clk, states of the differential signals rout and routb controlled by the equalizing circuit 28 and output the states as detection signals saout and saoutb. The state holding circuit 29 can hold past states of the differential signals rout and routb detected by the latch-type sense amplifier 25 and supply the past states to the equalizing circuit 28.

Specifically, the differential circuit 21 includes N-channel transistors T1 and T2, resistors R1 and R2, and a current source A1. A drain of the N-channel transistor T1 is connected to a power supply potential VDD via the resistor R1. A drain of the N-channel transistor T2 is connected to the power supply potential VDD via the resistor R2. Sources of the N-channel transistors T1 and T2 are connected to the current source A1. The readout signal Di is input to a gate of the N-channel transistor T1. The reference voltage vref is input to the gate of the N-channel transistor T2. A value of the reference voltage vref can be set to, for example, a half of a power supply potential VCCQ of the output buffer 12 shown in FIG. 1C.

The equalizing circuit 28 includes equalizing circuits 22 and 23 and a current setting circuit 26. The equalizing circuit 23 can control the potential of the present differential signals rout and routb output from the differential circuit 21 to cancel states of the one-cycle preceding differential signals rout and routb output from the differential circuit 21. The equalizing circuit 22 can control the potential of the present differential signals rout and routb output from the differential circuit 21 to cancel states of the two-cycles preceding differential signals rout and routb output from the differential circuit 21.

The equalizing circuit 22 includes N-channel transistors T3 and T4 and a variable current source A2. A drain of the N-channel transistor T3 is connected to the drain of the N-channel transistor T1. A drain of the N-channel transistor T4 is connected to the drain of the N-channel transistor T2. Sources of the N-channel transistors T3 and T4 are connected to the variable current source A2. The reference voltage vref is input to a gate of the N-channel transistor T3. An output Qpre1 of a flip-flop F1 is input to a gate of the N-channel transistor T4.

The equalizing circuit 23 includes N-channel transistors T5 and T6 and a variable current source A3. A drain of the N-channel transistor T5 is connected to the drain of the N-channel transistor T2. A drain of the N-channel transistor T6 is connected to the drain of the N-channel transistor T1. Sources of the N-channel transistors T5 and T6 are connected to the variable current source A3. An output Dout of a latch circuit 24 is input to a gate of the N-channel transistor T5. The reference voltage vref is input to a gate of the N-channel transistor T6.

The current setting circuit 26 can set, for each of the semiconductor chips CP1 to CPm, values of electric currents flowing to the variable current sources A2 and A3. The current setting circuit 26 includes a register 27 that stores the values of the electric currents set for each of the semiconductor chips CP1 to CPm. The value of the electric current flowing to the variable current source A2 is desirably set to be smaller than the value of the electric current flowing to the variable current source A3.

The latch-type sense amplifier 25 includes P-channel transistors T7 to T10 and N-channel transistors T11 to T16. A gate of the P-channel transistor T8 and a gate of the N-channel transistor T11 are connected to each other. A drain of the P-channel transistor T8 and a drain of the N-channel transistor T11 are connected to each other. A gate of the P-channel transistor T9 and a gate of the N-channel transistor T12 are connected to each other. A drain of the P-channel transistor T9 and a drain of the N-channel transistor T12 are connected to each other. The detection signal saout is input to the gate of the P-channel transistor T8, the gate of the N-channel transistor T11, the drain of the P-channel transistor T9, and the drain of the N-channel transistor T12. The detection signal saoutb is input to the gate of the P-channel transistor T9, the gate of the N-channel transistor T12, the drain of the P-channel transistor T8, and the drain of the N-channel transistor T11.

The P-channel transistor T7 is connected in parallel to the P-channel transistor T8. The P-channel transistor T10 is connected in parallel to the P-channel transistor T9. The clock signal clk is input to the gates of the P-channel transistors T7 and T10.

A source of the N-channel transistor T11 is connected to a drain of the N-channel transistor T13. A source of the N-channel transistor T12 is connected to a drain of the N-channel transistor T14. Sources of the N-channel transistors T13 and T14 are connected to a drain of the N-channel transistor T16. The drains of the N-channel transistors T13 and T14 are connected to each other via the N-channel transistor T15.

The state holding circuit 29 includes the latch circuit 24 and the flip-flop F1. The latch circuit 24 can hold states of the one-cycle preceding differential signals rout and routb detected by the latch-type sense amplifier 25 and supply the states to the equalizing circuit 23. The flip-flop F1 can hold states of the two-cycles preceding differential signals rout and routb detected by the latch-type sense amplifier 25 and supply the states to the equalizing circuit 22.

The latch circuit 24 includes NAND circuits N1 and N2. The detection signal saoutb is input to one input of the NAND circuit N1 and the detection signal saout is input to one input of the NAND circuit N2. An output of the NAND circuit N1 is connected to the other input of the NAND circuit N2. An output of the NAND circuit N2 is connected to the other input of the NAND circuit N1. The output of the NAND circuit N1 is connected to the gate of the N-channel transistor T5 and an input of the flip-flop F1. An output of the flip-flop F1 is connected to the gate of the N-channel transistor T4.

Figure 4:
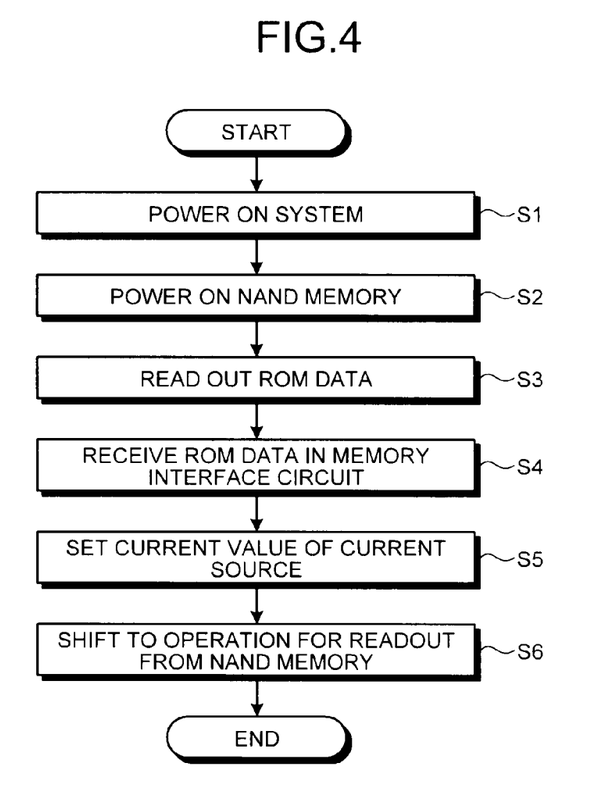
FIG. 4 is a flowchart of an example of the operation of the memory interface circuit shown in FIG. 1A.
Figures 5A, 5B:
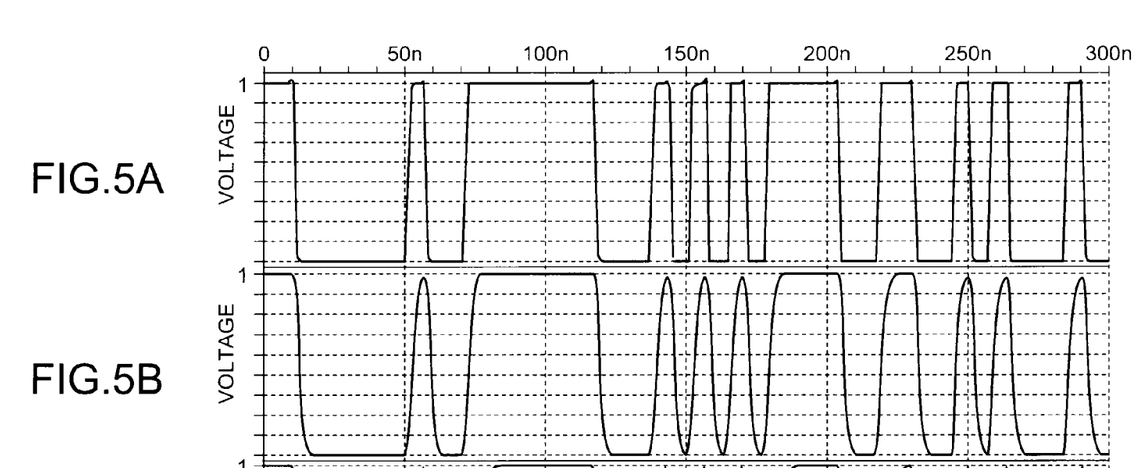
FIGS. 5A to 5D are diagrams of waveforms of signal amplitude of an output buffer shown in FIG. 1C obtained when a load capacitance is changed.
Figure 5C:
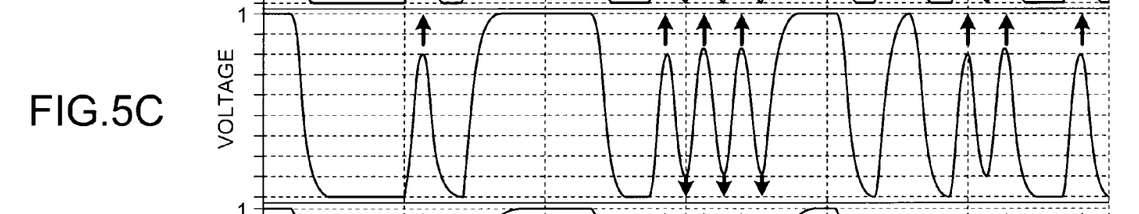
Figure 5D:
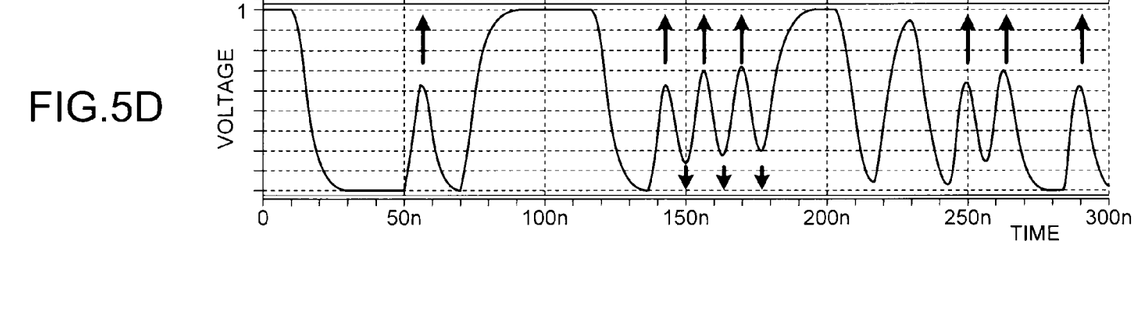

FIG. 4 is a flowchart of an example of the operation of the memory interface circuit shown in FIG. 1A.

In FIG. 4, when the semiconductor storage device shown in FIG. 1A is system-powered on (step S1) and the NAND memories 3-1 to 3-n are powered on (step S2), electric power is supplied to the memory interface circuit 1a shown in FIG. 3 and the NAND memories 3-1 to 3-n shown in FIG. 1A.

For example, when data is read out from the semiconductor chip CP1, the memory interface circuit 1a reads out ROM data from the programmable ROM 14 of the semiconductor chip CP1 as the readout signal Di (steps S3 and S4). Set values for setting values of electric currents flowing to the variable current sources A2 and A3 are stored in the register 27. When the memory interface circuit 1a reads out the ROM data from the programmable ROM 14, readout speed can be reduced not to cause wrong readout.

The current setting circuit 26 adjusts the values of the electric current flowing to the variable current sources A2 and A3 such that electric currents corresponding to the set values stored in the register 27 flow (step S5). When the values of the electric currents flowing to the variable current sources A2 and A3 are adjusted, the operation shifts to operation for readout from the NAND flash memory 13 of the semiconductor chip CP1 (step S6).

Readout data read out from the NAND flash memory 13 of the semiconductor chip CP1 is sent to the channel 2 via the output buffer 12 and received by the controller 1 side via the memory interface circuit 1a as the readout signal Di.

When the readout signal Di is received by the memory interface circuit 1a, the readout signal Di is input to the gate of the N-channel transistor T1. The differential circuit 21 compares the readout signal Di with the reference voltage vref, whereby the differential signals rout and routb are generated and output to the equalizing circuits 22 and 23 and the latch-type sense amplifier 25.

In the equalizing circuit 23, the output Dout of the latch circuit 24 is input to the gate of the N-channel transistor T5, whereby an amount of electric current flowing to the N-channel transistor T5 is controlled based on the states of the one-cycle preceding differential signals rout and routb held by the latch circuit 24.

Specifically, when the state of the one-cycle preceding differential signal rout is '1', the output Dout of the latch circuit 24 is at a high level and the electric current flowing to the N-channel transistor T5 increases. Therefore, the electric current is drawn from the drain of the N-channel transistor T2 via the N-channel transistor T5 and the potential of the present differential signal rout is lowered such that a state of the present differential signal rout is close to '0'.

On the other hand, when the state of the one-cycle preceding differential signal rout is '0', the output Dout of the latch circuit 24 is at a low level and the electric current flowing to the N-channel transistor T5 decreases. Therefore, the electric current is suppressed from being drawn from the drain of the N-channel transistor T2 via the N-channel transistor T5 and the potential of the present differential signal rout is raised such that the state of the present differential signal rout is close to '1'.

In the equalizing circuit 22, an output Qpre1 of the flip-flop F1 is input to the gate of the N-channel transistor T4, whereby an amount of electric current flowing to the N-channel transistor T4 is controlled based on the states of the two-cycles preceding differential signals rout and routb held by the flip-flop F1.

Specifically, when the state of the two-cycles preceding differential signal rout is '1', the output Qpre1 of the flip-flop F1 is at the high level and the electric current flowing to the N-channel transistor T4 increases. Therefore, the electric current is drawn from the drain of the N-channel transistor T2 via the N-channel transistor T4 and the potential of the present differential signal rout is lowered such that the state of the present differential signal rout is close to '0'.

On the other hand, when the state of the two-cycles preceding differential signal rout is '0', the output Qpre1 of the flip-flop F1 is at the low level and the electric current flowing to the N-channel transistor T4 decreases. Therefore, the electric current is suppressed from being drawn from the drain of the N-channel transistor T2 via the N-channel transistor T4 and the potential of the present differential signal rout is raised such that the state of the present differential signal rout is close to '1'.

When the present differential signals rout and routb, the potential of which is controlled by the equalizing circuits 22 and 23, are input to the latch-type sense amplifier 25, the differential signals rout and routb are respectively input to the gates of the N-channel transistors T13 and T14.

When the clock signal clk is at the low level, the P-channel transistors T7 and T10 are turned on and the N-channel transistor T16 is turned off. When the P-channel transistors T7 and T10 are turned on, the potential at the gates of the N-channel transistors T11 and T12 shifts to the high level and the N-channel transistors T11 and T12 are turned on. Therefore, irrespective of the potential of the differential signals rout and routb respectively input to the gates of the N-channel transistors T13 and T14, the detection signals saout and saoutb are maintained at the same potential.

When the clock signal clk shifts to the high level, the P-channel transistors T7 and T10 are turned off and the N-channel transistor T16 is turned on. Therefore, the potential at the sources of the N-channel transistors T11 and T12 fluctuates according to the potential of the present differential signals rout and routb. The potential at the drains of the N-channel transistors T11 and T12 fluctuates according to the potentials at the sources of the N-channel transistors T11 and T12. When one of the detection signals saout and saoutb is changed to '1' according to the potential at the drains of the N-channel transistors T11 and T12 by latch operations of the P-channel transistors T8 and T9 and the N-channel transistors T11 and T12, the state of the other of the detection signals saout and saoutb changes to '0' and the detection signals saout and saoutb are output to the latch circuit 24.

The latch circuit 24 holds the present detection signals saout and saoutb as the states of the one-cycle preceding differential signals rout and routb and outputs the present detection signals saout and saoutb to the flip-flop F1 and the equalizing circuit 23.

The flip-flop F1 captures the output Dout from the latch circuit 24 in synchronization with the clock signal clk. The flip-flop F1 holds the states of the one-cycle preceding differential signals rout and routb as the states of the two-cycles preceding differential signals rout and routb and outputs the states to the equalizing circuit 22.

Because the equalizing circuit 22 controls the potential of the present differential signals rout and routb output from the differential circuit 21 to be alienated from states of the past differential signals rout and routb output from the differential circuit 21, for example, when '0' is input as the one-cycle preceding differential signal rout and '1' is input as the differential signal rout of the present cycle, the potential of the differential signal rout of the present cycle can be raised. Therefore, it is possible to suppress a state of the differential signal rout of the present cycle from being dragged by the state '0' of the one-cycle preceding differential signal rout to be less easily raised. Even when readout speed is increased, it is possible to reduce wrong readout.

Because values of electric current flowing to the variable current sources A2 and A3 are separately set for each of the semiconductor chips CP1 to CPm shown in FIG. 1B, even when a transistor characteristic is alienated for each of the semiconductor chips CP1 to CPm, a condition of equalization by the equalizing circuit 28 can be optimized. Therefore, even when a load capacitance applied to the output buffers 12 of the semiconductor chips CP1 to CPm is large, it is possible to reduce deterioration in a readout waveform without increasing the size of the output buffers 12.

In the method explained in the first embodiment, to control the potential of the present differential signals rout and routb, the memory interface circuit 1a is caused to refer to the states of the one-cycle preceding differential signals rout and routb and the states of the two-cycles preceding differential signals rout and routb. However, the memory interface circuit 1a can also be caused to refer to only the states of the one-cycle preceding differential signals rout and routb or can also be caused to refer to states of the three-or-more-cycles preceding differential signals rout and routb.

FIGS. 5A to 5D are diagrams of waveforms of signal amplitude of the output buffer shown in FIG. 1C obtained when a load capacitance is changed. In an example shown in FIG. 5A, the load capacitance applied to the output buffer 12 is 5 picofarads. In an example shown in FIG. 5B, the load capacitance applied to the output buffer 12 is 30 picofarads. In an example shown in FIG. 5C, the load capacitance applied to the output buffer 12 is 60 picofarads. In an example shown in FIG. 5D, the load capacitance applied to the output buffer 12 is 90 picofarads. In the examples, readout speed is set to 150 megabits per second and a symbol sequence '10000101111001010101111001100101000010' is input as readout data.

In FIGS. 5A to 5D, when the load capacitance applied to the output buffer 12 shown in FIG. 1C is small, a signal can be transitioned between power supply potentials at full amplitude to correspond to the symbol sequence of the readout data. On the other hand, when the load capacitance applied to the output buffer 12 increases, the present state is dragged by a past state and the signal cannot be transitioned between power supply potentials at full amplitude to correspond to the symbol sequence of the readout data. Therefore, wrong readout occurs.

Because, when a state of a past signal is '0', the potential of a present signal is raised in a direction of '1' and, when the state of the past signal is '1', the potential of the present signal is lowered in a direction of '0', wrong readout can be reduced.

FIGS. 6A to 6D are diagrams of waveforms of signal amplitude of the output buffer shown in FIG. 1C obtained when an operating frequency is changed. In an example shown in FIG. 6A, the operating frequency is 20 megahertz. In an example shown in FIG. 6B, the operating frequency is 100 megahertz. In an example shown in FIG. 6C, the operating frequency is 200 megahertz. The load capacitance applied to the output buffer 12 shown in FIG. 1C is fixed.

In FIGS. 6A to 6D, when the operating frequency is low, a signal can be transitioned between power supply potentials at full amplitude to correspond to a symbol sequence of readout data. On the other hand, when the operating frequency increases, the next signal is input before the present signal is transitioned between power supply potentials at full amplitude. Therefore, wrong readout occurs.

Figure 6A:
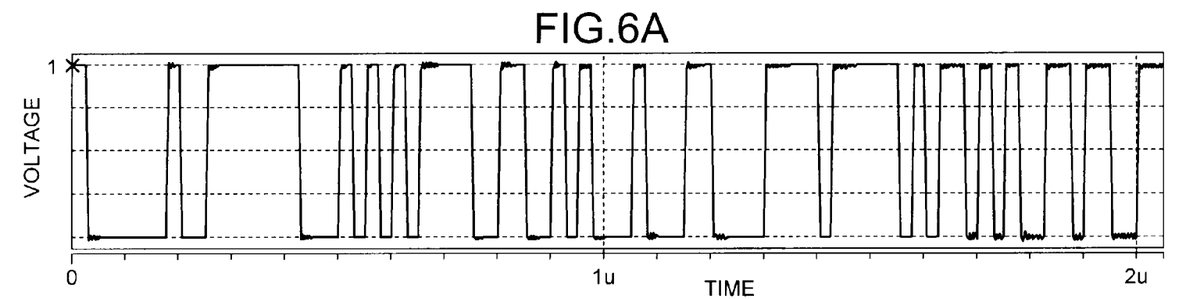
FIGS. 6A to 6C are diagrams of waveforms of signal amplitude of the output buffer shown in FIG. 1C obtained when an operating frequency is changed.
Figure 6B:
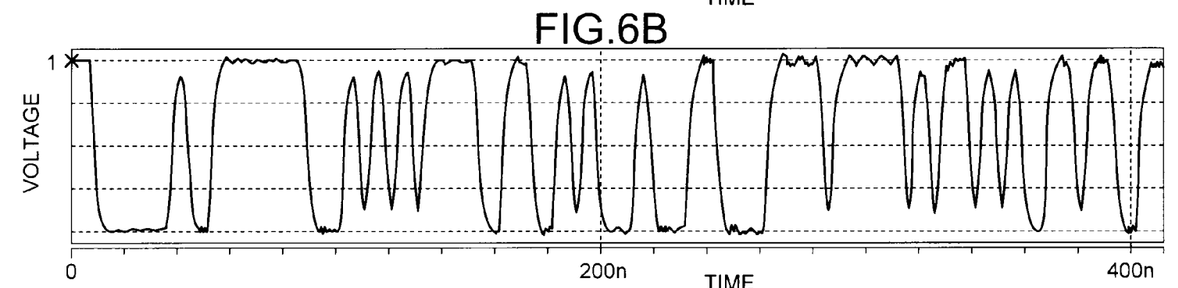
Figure 6C:
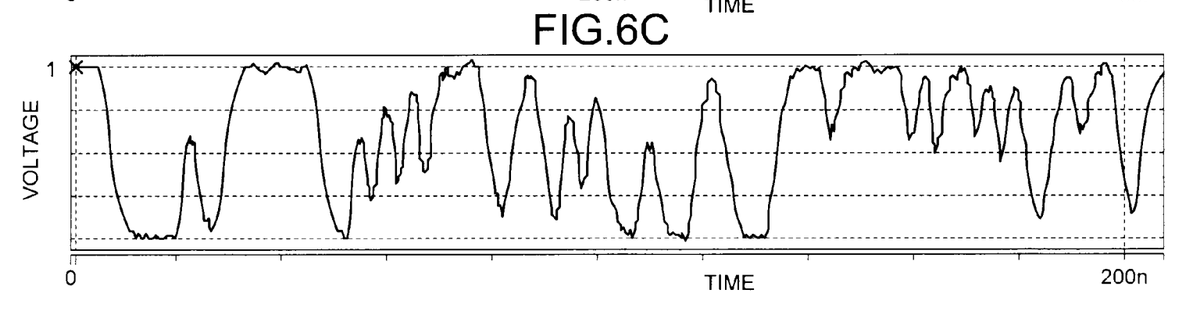

In such a case, as in the case explained above, because, when a state of the past signal is '0', the potential of the present signal is raised in a direction of '1' and, when the state of the past signal is '1', the potential of the present signal is lowered in a direction of '0', wrong readout can be reduced.

Figure 7A:
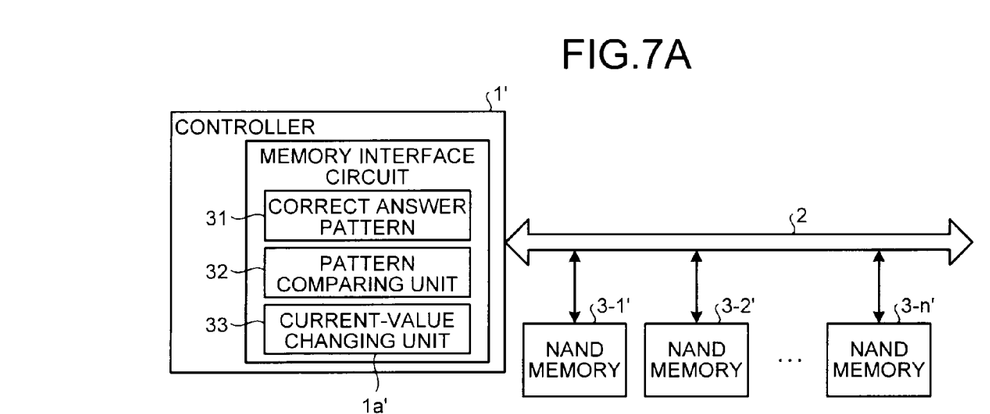
FIG. 7A is a block diagram of a schematic configuration of a semiconductor storage device to which a memory interface circuit according to a second embodiment of the present invention is applied.
Figure 7B:
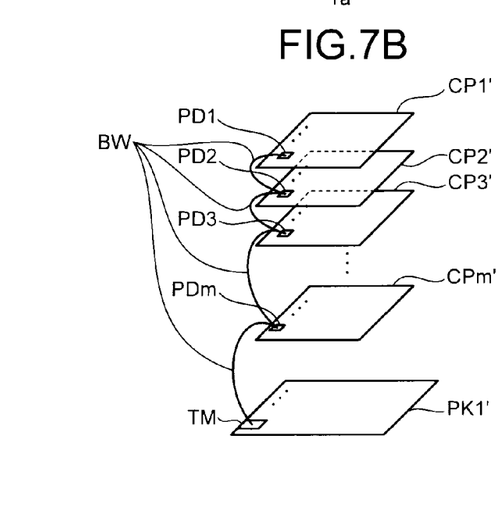
FIG. 7B is a perspective view of a schematic configuration of layers of a NAND memory 3-1' shown in FIG. 7A.
Figure 7C:
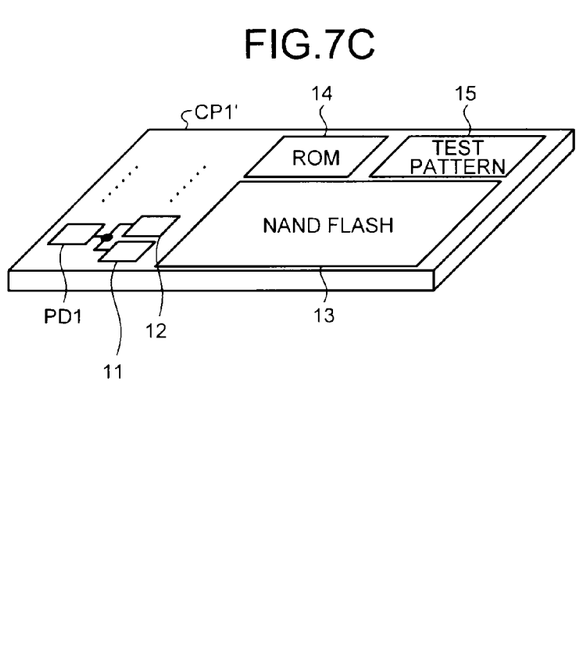
FIG. 7C is a perspective view of a schematic configuration of a semiconductor chip CP1' shown in FIG. 7B.

FIG. 7A is a block diagram of a schematic configuration of a semiconductor storage device to which a memory interface circuit according to a second embodiment of the present invention is applied. FIG. 7B is a perspective view of a schematic configuration of layers of a NAND memory 3-1' shown in FIG. 7A. FIG. 7C is a perspective view of a schematic configuration of a semiconductor chip CP1' shown in FIG. 7B.

In FIGS. 7A to 7C, the semiconductor storage device includes a controller 1' and NAND memories 3-1' to 3-n' instead of the controller 1 and the NAND memories 3-1 to 3-n shown in FIG. 1A. For example, the NAND memory 3-1' includes semiconductor chips CP1' to CPm'. For example, the semiconductor chip CP1' holds a test pattern 15 in addition to the components of the semiconductor chip CP shown in FIG. 1C. The semiconductor chips CP2' to CPm' other than the semiconductor chip CP1' can be configured in the same manner.

The controller 1' includes a memory interface circuit 1a' instead of the memory interface circuit 1a shown in FIG. 1A. The memory interface circuit 1a' holds a correct answer pattern 31 corresponding to the test pattern 15. The memory interface circuit 1a' includes a pattern comparing unit 32 and a current-value changing unit 33. The pattern comparing unit 32 can compare the test pattern 15 read out from the semiconductor chip CP1' and the correct answer pattern 31. The current-value changing unit 33 can change values of electric currents flowing to the variable current sources A2 and A3 shown in FIG. 3 such that the test pattern 15 and the correct answer pattern 31 coincide with each other.

Figure 8:
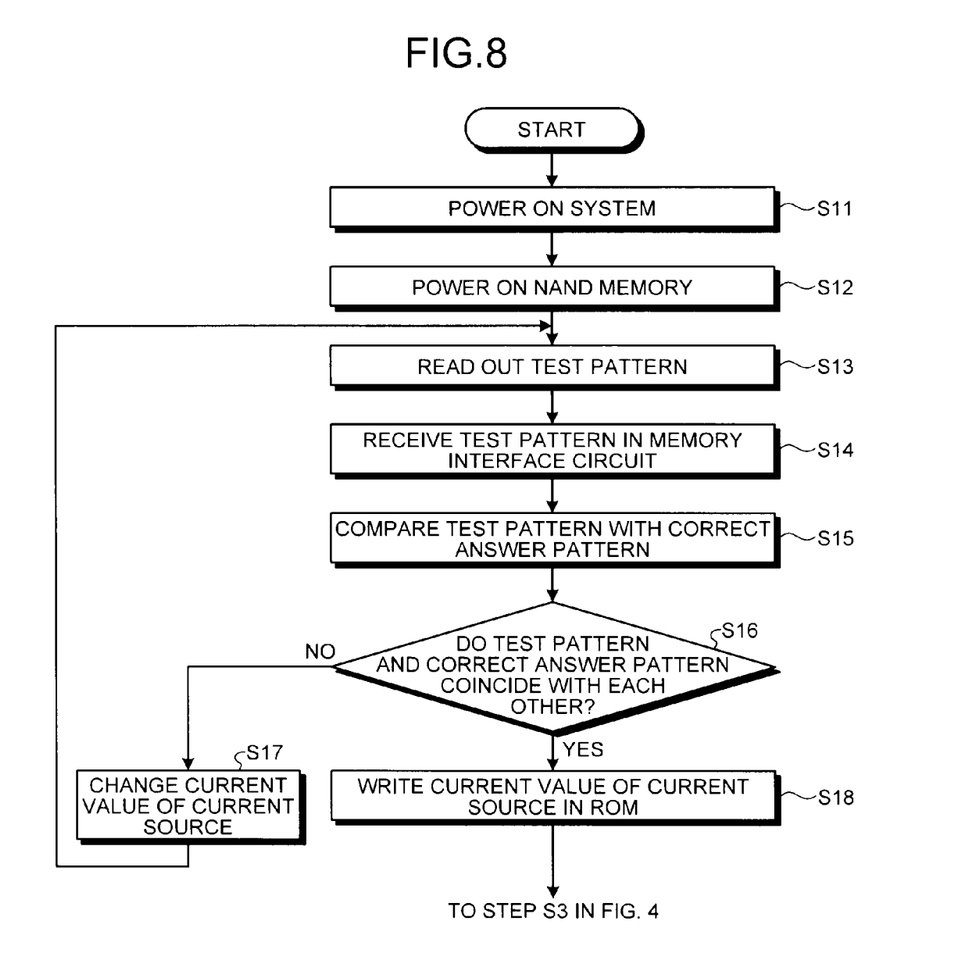
FIG. 8 is a flowchart for explaining an example of the operation of the memory interface circuit shown in FIG. 7A.

FIG. 8 is a flowchart for explaining an example of the operation of the memory interface circuit shown in FIG. 7A.

In FIG. 8, when the semiconductor storage device shown in FIG. 7A is system-powered on (step S11) and the NAND memories 3-1' to 3-n' are powered on (step S12), electric power is supplied to the memory interface circuit 1a' shown in FIG. 7A and the NAND memories 3-1' to 3-n' shown in FIG. 7A.

For example, when data is read out from the semiconductor chip CP1', the memory interface circuit 1a' reads out the test pattern 15 from the semiconductor chip CP1' (steps S13 and S14). The pattern comparing unit 32 compares the test pattern 15 and the correct answer pattern 31 (step S15). When the test pattern 15 and the correct answer pattern 31 do not coincide with each other (step S16), the current-value changing unit 33 changes the values of the electric currents flowing to the variable current sources A2 and A3 (step S17). The operation at steps S13 to S17 is repeated until the test pattern 15 and the correct answer pattern 31 coincide with each other. When the test pattern 15 and the correct answer pattern 31 coincide with each other, values of electric currents flowing to the variable current values A2 and A3 at that point are written in the programmable ROM 14 of the semiconductor chip CP1' (step S18). The operation proceeds to step S3 in FIG. 4, whereby the current setting circuit 26 adjusts the values of the electric currents flowing to the variable current sources A2 and A3.

Because the values of the electric currents flowing to the variable current sources A2 and A3 are set such that the test pattern 15 and the correct answer pattern 31 coincide with each other, even when a transistor characteristic changes with time in each of the semiconductor chips CP1' to CPm', a condition of equalization by the equalizing circuit 28 can be optimized.

Figure 9:
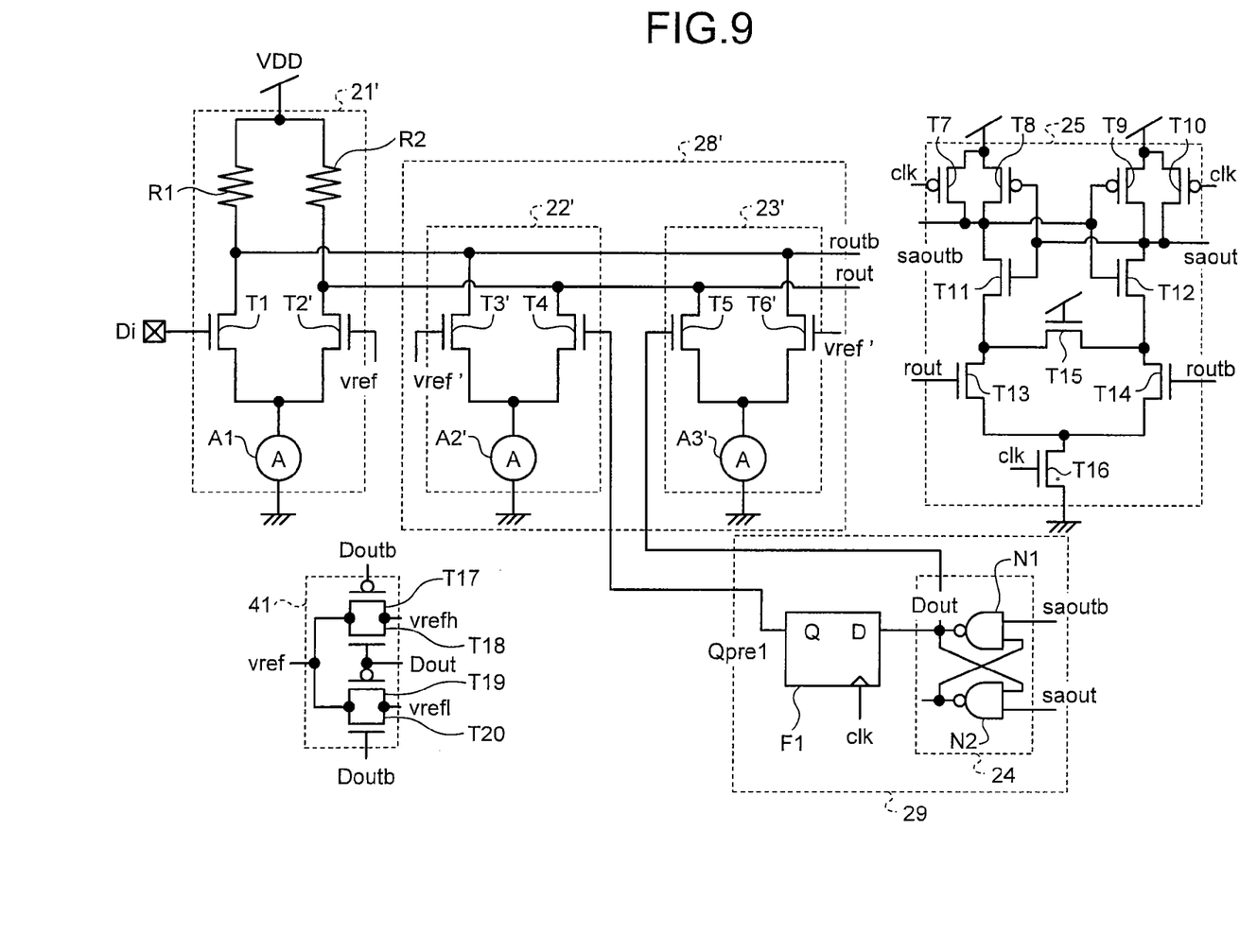
FIG. 9 is a circuit diagram of a schematic configuration of a memory interface circuit according to a third embodiment of the present invention.

FIG. 9 is a circuit diagram of a schematic configuration of a memory interface circuit according to a third embodiment of the present invention.

In FIG. 9, the memory interface circuit includes a differential circuit 21', an equalizing circuit 28', and a reference-current control unit 41 instead of the differential circuit 21 and the equalizing circuit 28 of the memory interface circuit shown in FIG. 3.

The differential circuit 21' can receive, as differential inputs, the readout signal Di read out from the NAND memories 3-1' to 3-n' and the reference voltage vref controlled by the reference-current control unit 41 and generate the differential signals rout and routb as differential outputs. The equalizing circuit 28' can compare states of the past differential signals rout and routb output from the differential circuit 21' with the reference voltage vref' and control the potential of the present differential signals rout and routb output from the differential circuit 21' to be alienated from states of the past differential signals rout and routb output from the differential circuit 21'. The reference-current control unit 41 can control the reference voltage vref based on the states of the past differential signals rout and routb held by the state holding circuit 29. The reference-current control unit 41 can control the reference voltage vref to be close to the states of the past differential signals rout and routb output from the differential circuit 21'. For example, when a state of a signal readout one cycle before is '0', the reference voltage vref input to the differential circuit 21' this time can be lowered. When the state of the signal read out one cycle before is '1', the reference voltage vref input to the differential circuit 21' this time can be raised.

Specifically, the differential circuit 21' shown in FIG. 9 includes an N-channel transistor T2' instead of the N-channel transistor T2 of the differential circuit 21 shown in FIG. 3. Whereas the reference voltage vref input to the gate of the N-channel transistor T2 is a fixed value, the reference voltage vref controlled by the reference-current control unit 41 is input to a gate of the N-channel transistor T2'.

The equalizing circuit 28' shown in FIG. 9 includes equalizing circuits 22' and 23' instead of the equalizing circuits 22 and 23 shown in FIG. 3. The equalizing circuits 22' and 23' respectively include N-channel transistors T3' and T6' instead of the N-channel transistors T3 and T6. Whereas the reference voltage vref same as the reference voltage vref input to the gate of the N-channel transistor T2 is input to the gates of the N-channel transistors T3 and T6 shown in FIG. 3, the reference voltage vref' independent from the reference voltage vref input to the gate of the N-channel transistor T2' is input to gates of the N-channel transistors T3' and T6' shown in FIG. 9. The equalizing circuits 22' and 23' respectively include current sources A2' and A3' instead of the variable current sources A2 and A3 shown in FIG. 3. Whereas the values of the electric currents flowing to the variable current sources A2 and A3 shown in FIG. 3 are set by the current setting circuit 26 for each of the semiconductor chips CP1 to CPm, values of electric currents flowing to the current sources A2' and A3' can be set in common to the semiconductor chips CP1' to CPm'.

The reference-current control unit 41 includes P-channel transistors T17 and T19 and N-channel transistors T18 and T20. A reference voltage vrefh is input to a drain of the P-channel transistor T17 and a drain of the N-channel transistor T18. A reference voltage vrefl is input to a drain of the P-channel transistor T19 and a drain of the N-channel transistor T20. A value of the reference voltage vrefh can be set larger than a value of the reference voltage vrefl. The output Dout of the NAND circuit N1 is input to a gate of the N-channel transistor T18 and a gate of the P-channel transistor T19. An inverted signal Doutb of the output Dout of the NAND circuit N1 is input to a gate of the N-channel transistor T20 and a gate of the P-channel transistor T17. Sources of the P-channel transistors T17 and T19 and sources of the N-channel transistors T18 and T20 are connected to the gate of the N-channel transistor T2'.

The reference voltage vref generated by the reference-current control unit 41 is input to the gate of the N-channel transistor T2'. When the readout signal Di is received by the memory interface circuit, the readout signal Di is input to the gate of the N-channel transistor T1. The differential circuit 21' compares the readout signal Di and the reference voltage vref to generate the differential signals rout and routb and outputs the differential signals rout and routb to the equalizing circuits 22' and 23' and the latch-type sense amplifier 25.

In the equalizing circuit 23', the output Dout of the latch circuit 24 is input to the gate of the N-channel transistor T5 and compared with the reference voltage vref', whereby an amount of electric current flowing to the N-channel transistor T5 is controlled and the potential of the present differential signal rout is controlled.

In the equalizing circuit 22', the output Qpre1 of the flip-flop F1 is input to the gate of the N-channel transistor T4 and compared with the reference voltage vref', whereby an amount of electric current flowing to the N-channel transistor T4 is controlled and the potential of the present differential signal rout is controlled.

When the present differential signals rout and routb, the potential of which is controlled by the equalizing circuits 22' and 23', are input to the latch-type sense amplifier 25, states of the present differential signals rout and routb are detected and the detection signals saout and saoutb at that point are output to the latch circuit 24.

The latch circuit 24 holds the present detection signals saout and saoutb as states of the one-cycle preceding differential signals rout and routb and outputs the present detection signals saout and saoutb to the equalizing circuit 23' and the reference-current control unit 41. The flip-flop F1 holds the states of the one-cycle preceding differential signals rout and routb held by the latch circuit 24 as states of the two-cycles preceding differential signals rout and routb and outputs the states to the equalizing circuit 22'.

In the reference-current control unit 41, when the output Dout of the NAND circuit N1 shifts to the high level, the P-channel transistor T17 and the N-channel transistor T18 are turned on and the P-channel transistor T19 and the N-channel transistor T20 are turned off. The reference voltage vrefh is output to the gate of the N-channel transistor T2' as the reference voltage vref. On the other hand, when the output Dout of the NAND circuit N1 shifts to the low level, the P-channel transistor T17 and the N-channel transistor T18 are turned off and the P-channel transistor T19 and the N-channel transistor T20 are turned on. The reference voltage vrefl is output to the gate of the N-channel transistor T2' as the reference voltage vref.

Because the reference voltage vref is controlled to be close to the states of the past differential signals rout and routb output from the differential circuit 21', for example, when '0' is input as the one-cycle preceding differential signal rout, the reference voltage vref can be lowered. Therefore, when '1' is input as the differential signal rout of the present cycle, even when a state of the differential signal route of the present cycle is dragged by the state '0' of the one-cycle preceding differential signal rout to be less easily raised, it is possible to make it easy to discriminate whether the state of the differential signal rout of the present cycle changes to '1'.

In the example shown in FIG. 9, the equalizing circuit 28' is provided. However, the equalizing circuit 28' can be omitted. In the example shown in FIG. 9, the method of setting values of electric currents flowing to the current sources A2' and A3' in common to the semiconductor chips CP1 to CPm is explained. However, the current setting circuit 26 shown in FIG. 3 can be provided to make it possible to set values of electric currents flowing to the current sources A2' and A3' separately for each of the semiconductor chips CP1' to CPm'.

In the embodiments, the NAND memory is explained as an example of the semiconductor storage device. However, the semiconductor storage device can be a resistance random access memory (ReRAM), a programmable conductor random access memory (PCRAM), or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory interface circuit provided in a controller that performs reading and writing control for a semiconductor storage element and configured to exchange signals between the semiconductor storage element and the controller, the memory interface circuit comprising:
   a differential circuit that receives, as differential inputs, a readout signal read out from the semiconductor storage element and a reference voltage;
   an equalizing circuit that controls, taking into account a state of a past input signal output from the differential circuit, potential of a present differential signal output from the differential circuit;
   a sense amplifier that detects a state of the differential signal controlled by the equalizing circuit; and
   a state holding circuit that holds a past state of the differential signal detected by the sense amplifier and supplies the state to the equalizing circuit.

2. The memory interface circuit according to claim 1, wherein
   a setting parameter of the equalizing circuit is stored in a semiconductor chip on which the semiconductor storage element is formed, and
   the memory interface circuit reads out the setting parameter from the semiconductor chip on which the semiconductor storage element is formed and sets the setting parameter in the equalizing circuit, before reading data from the semiconductor storage element.

3. The memory interface circuit according to claim 2, wherein a plurality m (m is an integer equal to or larger than 2) of the semiconductor chips are provided, and the setting parameter is stored in each of the semiconductor chips according to characteristics of semiconductor storage elements formed on the semiconductor chips.

4. The memory interface circuit according to claim 1, wherein the equalizing circuit includes:
   a first transistor that draws, based on the reference voltage, an electric current from one output terminal of the differential circuit;

a second transistor that draws, based on the past state of the differential signal held by the state holding circuit, an electric current from the other output terminal of the differential circuit;

a current source that feeds the electric currents drawn by the first transistor and the second transistor; and a current setting circuit that sets, for each semiconductor chip on which the semiconductor storage element is formed, a value of an electric current flowing to the current source.

5. The memory interface circuit according to claim 4, further comprising:

a semiconductor package mounted with a plurality m (m is an integer equal to or larger than 2) of the semiconductor chips; and an external terminal provided in the semiconductor package and shared by pad electrodes of the m semiconductor chips.

6. The memory interface circuit according to claim 4, wherein the semiconductor chip includes a programmable ROM that stores ROM data corresponding to the value of the electric current flowing to the current source, and the memory interface circuit reads out, before reading out data from the semiconductor storage element, the ROM data from the programmable ROM Of the semiconductor chip on which the semiconductor storage element is formed and sets the ROM data in the current setting circuit as the value of the electric current.

7. The memory interface circuit according to claim 6, wherein the memory interface circuit sets readout speed in reading out the ROM data from the programmable ROM lower than readout speed in reading out the data from the semiconductor storage element.

8. The memory interface circuit according to claim 6, wherein the semiconductor chip includes an output buffer in which a signal is transitioned between a power supply and a ground level at full amplitude.

9. The memory interface circuit according to claim 1, wherein the equalizing circuit raises, when a state of a signal read out one cycle before is '0', potential of a signal read out this time such that a state of the signal read out this time is close to '1' and lowers, when the state of the signal read out one cycle before is '1', the potential of the signal read out this time such that the state of the signal read out this time is close to '0'.

10. The memory interface circuit according to claim 1, wherein the equalizing circuit includes:

a first equalizing circuit that controls the potential of the present differential signal output from the differential circuit to cancel a state of a one-cycle preceding differential signal output from the differential circuit; and a second equalizing circuit that controls the potential of the present differential circuit output from the differential circuit to cancel a state of a two-cycles preceding differential signal output from the differential circuit.

11. The memory interface circuit according to claim 1, wherein the state holding circuit includes:

a latch circuit that holds a state of a one-cycle preceding differential signal detected by the sense amplifier and supplies the state to the first equalizing circuit; and a flip-flop that holds a state of a two-cycles preceding differential signal detected by the sense amplifier and supplies the state to the second equalizing circuit.

12. The memory interface circuit according to claim 4, further comprising:

a pattern comparing unit that compares a test pattern read out from the semiconductor chip on which the semiconductor storage element is formed and a correct answer pattern; and a current-value changing unit that changes the value of the electric current flowing to the current source such that the test pattern and the correct answer pattern coincide with each other.

13. The memory interface circuit according to claim 12, wherein the memory interface circuit reads out, before reading out data from the semiconductor storage element, the test pattern from the semiconductor chip and compares the test pattern and the correct answer pattern.

14. A memory interface circuit provided in a controller that performs reading and writing control for a semiconductor storage element and configured to exchange signals between the semiconductor storage element and the controller, the memory interface circuit comprising:

a differential circuit that receives, as differential inputs, a readout signal read out from the semiconductor storage element and a first reference voltage and outputs a differential signal according to the input signal;

a sense amplifier that detects a state of the differential signal output from the differential circuit;

a state holding circuit that holds a past state of the differential signal detected by the sense amplifier, wherein the state holding circuit includes:

a latch circuit that holds a state of a one-cycle preceding differential signal detected by the sense amplifier and supplies the state to an equalizing circuit; and a flip-flop that holds a state of a two-cycles preceding differential signal detected by the sense amplifier and supplies the state to the equalizing circuit; and a reference-current control unit that controls the first reference voltage based on the past state of the differential signal held by the state holding circuit.

15. The memory interface circuit according to claim 14, wherein the reference-current control unit controls the first reference voltage to be close to the state of the past state of the differential signal output from the differential circuit.

16. The memory interface circuit according to claim 15, wherein the equalizing circuit controls potential of a present differential signal output from the differential circuit to cancel the past state of the differential signal output from the differential circuit.

17. The memory interface circuit according to claim 16, wherein the equalizing circuit includes:

a first transistor that draws, based on a second reference voltage, an electric current from one output terminal of the differential circuit;

a second transistor that draws, based on the past state of the differential signal held by the state holding circuit, an electric current from the other output terminal of the differential circuit;

a current source that feeds the electric currents drawn by the first transistor and the second transistor; and a current setting circuit that sets, for each semiconductor chip on which the semiconductor storage element is formed, a value of an electric current flowing to the current source.

18. The memory interface circuit according to claim 16, wherein the equalizing circuit raises, when a state of a signal read out one cycle before is '0', potential of a signal read out this time such that a state of the signal read out this time is close to '1' and lowers, when the state of the signal read out one cycle before is '1', the potential of the signal read out this time such that the state of the signal read out this time is close to '0'.

19. The memory interface circuit according to claim 16, wherein the equalizing circuit includes:
   a first equalizing circuit that controls the potential of the present differential signal output from the differential circuit to cancel a state of a one-cycle preceding differential signal output from the differential circuit; and
   a second equalizing circuit that controls the potential of the present differential circuit output from the differential circuit to cancel a state of a two-cycles preceding differential signal output from the differential circuit.

20. The memory interface circuit according to claim 19, wherein:
   the latch circuit of the state holding circuit supplies the state of a one-cycle preceding differential signal detected by the sense amplifier to the first equalizing circuit; and
   the flip-flop of the state holding circuit supplies the state of a two-cycles preceding differential signal detected by the sense amplifier to the second equalizing circuit.

* * * * *